United States Patent
Cai

(10) Patent No.: US 10,256,425 B2
(45) Date of Patent: Apr. 9, 2019

(54) DISPLAY SUBSTRATE AND MANUFACTURING METHOD THEREOF, DISPLAY DEVICE AND MANUFACTURING METHOD THEREOF

(71) Applicant: BOE Technology Group Co., Ltd., Beijing (CN)

(72) Inventor: Peng Cai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/544,727

(22) PCT Filed: Mar. 9, 2016

(86) PCT No.: PCT/CN2016/075980
§ 371 (c)(1),
(2) Date: Jul. 19, 2017

(87) PCT Pub. No.: WO2016/169347
PCT Pub. Date: Oct. 27, 2016

(65) Prior Publication Data
US 2018/0013079 A1    Jan. 11, 2018

(30) Foreign Application Priority Data
Apr. 24, 2015    (CN) .......................... 2015 1 0201757

(51) Int. Cl.
*H01L 51/00*    (2006.01)
*H01L 27/12*    (2006.01)
(Continued)

(52) U.S. Cl.
CPC .......... *H01L 51/0097* (2013.01); *H01L 27/12* (2013.01); *H01L 27/3246* (2013.01);
(Continued)

(58) Field of Classification Search
None
See application file for complete search history.

(56) References Cited

U.S. PATENT DOCUMENTS

| | | | |
|---|---|---|---|
| 2007/0042613 A1 | 2/2007 | Yoda | |
| 2012/0062447 A1 | 3/2012 | Tseng et al. | |

(Continued)

FOREIGN PATENT DOCUMENTS

| | | |
|---|---|---|
| CN | 1915668 A | 2/2007 |
| CN | 101852932 | 10/2010 |

(Continued)

OTHER PUBLICATIONS

International Search Report from corresponding PCT Application No. PCT/CN2016/075980 dated Jun. 15, 2016 (3 pages).
(Continued)

*Primary Examiner* — Eva Y Montalvo
*Assistant Examiner* — Kevin Quinto
(74) *Attorney, Agent, or Firm* — Harness, Dickey & Pierce, P.L.C.

(57) ABSTRACT

The present disclosure provides a display substrate, comprising: a bending resistant region; the region comprises a base and a metal wire layer, wherein the metal wire layer is directly formed on the base, or the region further comprises an organic buffer layer located between the base and the metal wire layer, and the metal wire layer is directly formed on the organic buffer layer. The present disclosure provides a method for manufacturing the display substrate above-described. The present disclosure further provides a display device, comprising the display substrate above-described. The present disclosure further provides a method for manufacturing the display device, comprising the method for manufacturing the display substrate above-described. The present disclosure forms a bending resistant structure in a
(Continued)

predetermined bending resistant region on the bezel portions of the display substrate, which can enhance the bend resistance thereof and improve the quality of the flexible display.

19 Claims, 4 Drawing Sheets

(51) Int. Cl.
  *H01L 27/32* (2006.01)
  *H01L 51/52* (2006.01)
  *H01L 51/56* (2006.01)

(52) U.S. Cl.
  CPC ...... *H01L 27/3258* (2013.01); *H01L 27/3276* (2013.01); *H01L 51/5237* (2013.01); *H01L 51/5256* (2013.01); *H01L 51/56* (2013.01); *H01L 2227/323* (2013.01); *H01L 2251/5338* (2013.01)

(56) References Cited

U.S. PATENT DOCUMENTS

2013/0168679 A1* 7/2013 Park ................... H01L 27/3276
  257/59
2014/0042406 A1   2/2014 Degner et al.
2014/0217397 A1* 8/2014 Kwak ................. H01L 27/1218
  257/43
2014/0232956 A1   8/2014 Kwon et al.

FOREIGN PATENT DOCUMENTS

| CN | 104091821 A | 10/2014 |
| --- | --- | --- |
| CN | 104521331 | 4/2015 |
| CN | 104934438 | 9/2015 |

OTHER PUBLICATIONS

Written Opinion from corresponding PCT Application No. PCT/CN2016/075980 dated Jun. 15, 2016 (4 pages).
Office Action from corresponding Chinese Application No. 201510201757.1 dated May 31, 2017 (12 pages).
Office Action from corresponding Chinese Application No. 201510201757.1 dated Jan. 17, 2018 (12 pages).
Office Action from Chinese Application No. 201510201757.1 dated Jun. 14, 2018 (13 pages).

* cited by examiner

DISPLAY SUBSTRATE AND MANUFACTURING METHOD THEREOF, DISPLAY DEVICE AND MANUFACTURING METHOD THEREOF

CROSS-REFERENCE TO RELATED APPLICATION

This application claims the benefit and priority of Chinese Patent Application No. 201510201757.1, filed on Apr. 24, 2015, the entire content of which is incorporated by reference herein.

FIELD OF THE DISCLOSURE

The present disclosure relates to a technical field of semiconductor preparation, and more particularly, to a display substrate and a method manufacturing thereof, a display device and a manufacturing method thereof.

BACKGROUND

A flexible display device is a display device formed based on a flexible base material. As the flexible display device has the characteristics of being flexible, wide viewing angle and being easy to carry, the flexible display device has a wide application prospect and good market potential in most display applications such as portable products.

In the prior art, the upper and lower layers of the metal wire of the bezel portion of the flexible display device are made of an inorganic film layer, and the inorganic film layer is usually made of a material such as SiNx or SiOx, resulting in poor ductility of the inorganic film layer, the metal wire is more likely to be broken due to the breakage of the inorganic film layer when the bezel of the flexible display device is bent, thereby affecting the display quality of the flexible display device.

BRIEF SUMMARY OF THE DISCLOSURE

The present disclosure provides a display substrate and a manufacturing method thereof, and a display device, which can address the defect that the metal wire is more likely to be broken due to the breakage of the inorganic film layer when the bezel of the flexible display device of the prior art is bent.

In a first aspect, the present disclosure provides a display substrate comprising a base and a metal wire layer on the base, wherein the display substrate comprises a first region, the base has a first base portion in the first region, and the metal wire layer has a first metal wire layer portion in the first region, and wherein, the first metal wire layer portion is directly formed on the first base portion, or, an organic buffer layer is formed between the first base portion and the first metal wire layer portion, and the first metal wire layer portion is directly formed on the organic buffer layer.

In one embodiment, the display substrate further comprises a second region adjacent to the first region, wherein the base has a second base portion in the second region, the metal wire layer has a second metal wire layer portion in the second region, and wherein, an inorganic insulating layer is further provided on the second base portion, and the second metal wire layer portion is formed on the inorganic insulating layer.

In one embodiment, the display substrate further comprises a display region, and the first region is located in bezel regions on both sides of the display region.

In one embodiment, the inorganic insulating layer comprises an inorganic buffer layer and a gate insulating layer, wherein the metal wire layer is a gate metal layer, and an interlayer insulating layer, a passivation layer, a planarization layer, a pixel defining layer and a packaging layer are sequentially formed on the gate metal layer.

In one embodiment, the interlayer insulating layer and the passivation layer are discontinuous such that the interlayer insulating layer and the passivation layer are not provided on the first metal wire layer portion.

In one embodiment, the inorganic insulating layer comprises an inorganic buffer layer, a gate insulating layer and an interlayer insulating layer, wherein the metal wire layer is a source/drain metal layer, and a passivation layer, a planarization layer, a pixel defining layer, and a packaging layer are sequentially formed on the source/drain metal layer.

In one embodiment, the passivation layer is discontinuous such that no passivation layer is present on the first metal wire layer portion.

In one embodiment, the first metal wire layer portion is directly formed on the first base portion and a thickness of the first metal wire layer portion is greater than or equal to a thickness of the second metal wire layer portion such that the upper surface of the metal wire layer is flat.

In one embodiment, the base comprises at least one of polyimide, polycarbonate, polyacrylate, polyetherimide, polyethersulfone, polyethylene terephthalate and polyethylene naphthalate.

In one embodiment, the packaging layer is formed by alternately depositing a plurality of inorganic layers and organic layers.

In a second aspect, the present disclosure provides a method for manufacturing a display substrate, comprising:
 providing a base;
 forming a metal wire layer on the base such that:
 a first metal wire layer portion of the metal wire layer is directly formed on a first base portion of the base,
 or,
 an organic buffer layer is provided between a first metal wire layer portion of the metal wire layer and a first base portion of the base, and the first metal wire layer portion is directly provided on the organic buffer layer.

In one embodiment, the base further has a second base portion, the method further comprising:
 providing an inorganic insulating layer only on the second base portion such that the inorganic insulating layer is provided between the second base portion of the base and the second metal wire layer portion of the metal wire layer.

In one embodiment, the base further has a second base portion, the method further comprising:
 forming an inorganic insulating layer on the first base portion and the second base portion;
 removing the inorganic insulating layer on the first base portion.

In one embodiment, the inorganic insulating layer comprises an inorganic buffer layer and a gate insulating layer, the metal wire layer being a gate metal layer, the method further comprising:
 sequentially forming an interlayer insulating layer, a passivation layer, a planarization layer, a pixel defining layer and a packaging layer on the gate metal layer.

In one embodiment, the interlayer insulating layer and the passivation layer are discontinuous such that the interlayer insulating layer and the passivation layer are not provided on the first metal wire layer portion.

In one embodiment, the inorganic insulating layer comprises an inorganic buffer layer, a gate insulating layer and an interlayer insulating layer, the metal wire layer being a source/drain metal layer, the method further comprising:

sequentially forming a passivation layer, a planarization layer, a pixel defining layer and a packaging layer on the source/drain metal layer.

In one embodiment, the passivation layer is continuous such that no passivation layer is present on the first metal wire layer portion.

In one embodiment, forming the packaging layer comprises:

alternately depositing a plurality of inorganic layers and organic layers to form the packaging layer.

In a third aspect, the present disclosure provides a display device comprising the above-described display substrate.

In a fourth aspect, the present disclosure provides a method for manufacturing a display device, comprising the method for manufacturing the display substrate as described above.

According to the above-described technical solutions, it can be seen that the present disclosure provides a display substrate and a manufacturing method thereof, a display device and a manufacturing method thereof, wherein a bending resistant structure is formed in a predetermined region to be bent in the bezel portions of the display substrate, which can enhance the bending resistance thereof and improve the quality of the flexible display.

BRIEF DESCRIPTION OF THE DRAWINGS

In order to more clearly illustrate the embodiments of the present disclosure or the technical solutions in the prior art, the following drawings, which are to be used in the description of the embodiments or the prior art, are briefly described below, and it will be apparent that the drawings in the following description are only a few of the embodiments of the present disclosure and that those of ordinary skill in the art may also obtain other drawings according to these drawings without creative work.

Reference signs in FIGS. 1-9 are as follows: 1—base; 2—inorganic buffer layer; 3—gate insulating layer; 4—metal wire layer; 5—interlayer insulating layer; 6—passivation layer; 7—planarization layer; 8—pixel defining layer; 9—packaging layer; 10—organic buffer layer; 12—display region; 13—bending resistant region; 14—display substrate.

DETAILED DESCRIPTION

The technical solutions in the embodiments of the present disclosure will now be described clearly and completely in conjunction with the accompanying drawings in the embodiments of the present disclosure, and it will be apparent that the described embodiments are merely part not all of the embodiments of the present disclosure. All other embodiments obtained by those of ordinary skill in the art based on the embodiments in the present disclosure without making creative work are within the scope of the present disclosure.

When introducing the elements and embodiments of the present disclosure, the articles "a", "an", "the" and "said" are intended to refer to the presence of one or more elements. The phrasing "containing", "comprising", "including" and "having" are intended to be inclusive and indicate that there may be additional elements other than the listed elements. The use of the phrasing indicating a particular orientation (e.g., "top", "bottom", "side", etc.) is for convenience of description and does not require any particular orientation of the described item.

An embodiment of the present disclosure provides a display substrate comprising a base and a metal wire layer on the base, wherein the display substrate further comprises a first region having a first base portion substrate in the first region, the metal wire layer having a first metal wire layer portion in the first region, and wherein the first metal wire layer portion is directly formed on the first base portion or an organic buffer layer between the first base portion and the first metal wire layer portion, the first metal wire layer portion being directly formed on the organic buffer layer.

Specifically, in the bending resistant region (i.e. the first region), if the metal wire layer is directly formed on the base, that is, the metal wire layer is in direct contact with the flexible base, it is possible to prevent the breakage of the metal wire layer due to the breakage of the gate insulating layer and the inorganic buffer layer when they are being bent; while if an organic buffer layer is first formed on the base and then the metal wire layer is directly formed on the organic buffer layer, it is also possible to effectively prevent the breakage of the metal wire layer when this region is bent.

Figure 1:
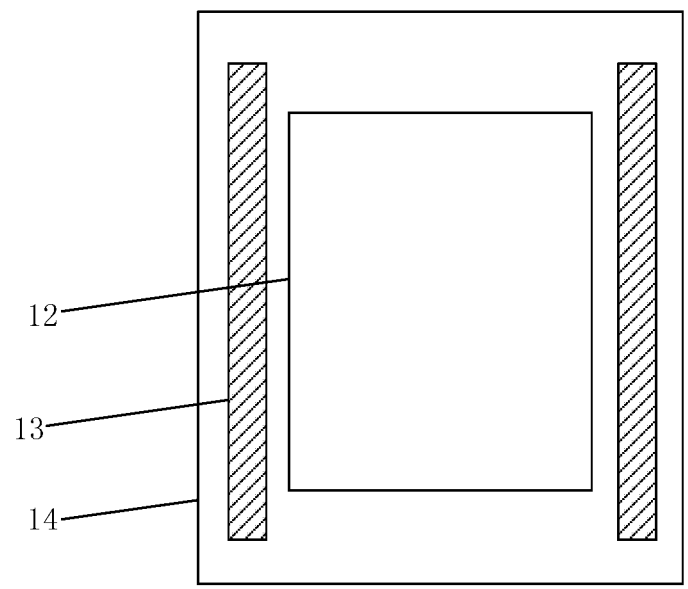
FIG. 1 is a top view of a display substrate provided in an embodiment of the present disclosure.
Figure 2:
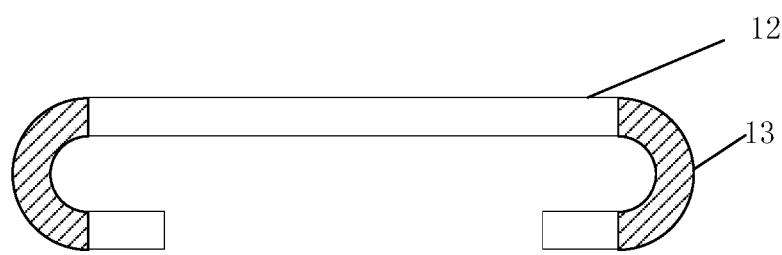
FIG. 2 is a side view of a display substrate provided in an embodiment of the present disclosure.

In the present embodiment, as shown in FIGS. 1 and 2, the display substrate 14 further comprises a display region 12, and the bending resistant region 13 is located in bezel regions on both sides of the display region 12.

In one embodiment, an inorganic insulating layer is further provided on the base (specifically, the second base portion of the base) in a region adjacent to the bending resistant region (i.e. a second region), and a metal wire layer (specifically, a second metal wire layer portion of the metal wire layer) is formed on the inorganic insulating layer.

Alternatively, if the inorganic insulating layer comprises an inorganic buffer layer and a gate insulating layer, the metal wire layer is a gate metal layer, and an interlayer insulating layer, a passivation layer, a planarization layer, a pixel defining layer and a packaging layer are sequentially formed on the gate metal layer.

In one embodiment, the interlayer insulating layer and the passivation layer are discontinuous such that the interlayer insulating layer and the passivation layer are not provided on the first metal wire layer portion.

Alternatively, if the inorganic insulating layer comprises an inorganic buffer layer, a gate insulating layer and an interlayer insulating layer, the metal wire layer is a source/drain metal layer, and a passivation layer, a planarization layer, a pixel defining layer, and a packaging layer are sequentially formed on the source/drain metal layer.

In one embodiment, the passivation layer is discontinuous such that no passivation layer is present on the first metal wire layer portion.

It can be seen that, when the metal wire layer is formed of a gate metal layer, the inorganic insulating layer comprises an inorganic buffer layer and a gate insulating layer; when the metal wire layer is formed of a source/drain metal layer, the inorganic insulating layer comprises an inorganic buffer layer, a gate insulating layer and an interlayer insulating layer.

In one embodiment, in the first region (i.e. a bending resistant region), the first metal wire layer portion is directly formed on the first base portion and the thickness of the first metal wire layer portion is larger than the thickness of the second metal wire layer such that the upper surface of the metal wire layer is flat. It is to be understood that the thickness of the metal wire layer in the bending resistant region (i.e. the thickness of the first metal wire layer portion) may also be equal to the thickness of the metal wire layer in the region adjacent to the bending resistant region (i.e. the thickness of the second metal wire layer portion).

In one embodiment, the base comprises at least one of polyimide, polycarbonate, polyacrylate, polyetherimide, polyethersulfone, polyethylene terephthalate and polyethylene naphthalate. The base may be a flexible base.

In one embodiment, the packaging layer is formed by alternately depositing a plurality of inorganic layers and organic layers.

Another embodiment of the present disclosure provides a method for manufacturing a display substrate comprising:

Providing a substrate; forming a metal wire layer on the base such that:

a first metal wire layer portion of the metal wire layer is directly formed on a first base portion of the base, or an organic buffer layer is provided between a first metal wire layer portion of the metal wire layer and a first base portion of the base, and the first metal wire layer portion is directly provided on the organic buffer layer.

In one embodiment, the base further has a second base portion, the method further comprising providing an inorganic insulating layer only on the second base portion such that an inorganic insulating layer is provided between the second base portion of the base and the second metal wire layer portion of the metal wire layer.

In another embodiment, the base further has a second base portion, the method further comprising: forming an inorganic insulating layer on the first base portion and the second base portion; removing the inorganic insulating layer on the first base portion.

Specifically, in the bending resistant region, the metal wire layer is directly formed on the base, then the metal wire layer is in direct contact with the flexible base, and it is possible to prevent the breakage of the metal wire layer due to the breakage of the gate insulating layer and the inorganic buffer layer when they are being bent; while if an organic buffer layer is first formed on the base and then the metal wire layer is directly formed on the organic buffer layer, it is also possible to effectively prevent the breakage of the metal wire layer when this region is bent.

An embodiment of the present disclosure provides a method for manufacturing a display substrate in which the above-described bending resistant structure is formed in a predetermined bent region in the bezel portions of the display substrate, which can enhance the bending resistance and improve the quality of the flexible display.

In one embodiment, if the inorganic insulating layer comprises an inorganic buffer layer and a gate insulating layer, the metal wire layer being a gate metal layer, then the method further comprises:

Sequentially forming an interlayer insulating layer, a passivation layer, a planarization layer, a pixel defining layer and a packaging layer on the gate metal layer. In one embodiment, the interlayer insulating layer and the passivation layer are discontinuous such that the interlayer insulating layer and the passivation layer are not provided on the first metal wire layer portion.

It is to be understood that if the inorganic insulating layer comprises an inorganic buffer layer and a gate insulating layer, the metal wire layer is a gate metal layer. Then, in a predetermined bending resistant region, the inorganic buffer layer and the gate insulating layer are etched such that the metal wire layer is directly formed on the base or the organic buffer layer.

In one embodiment, if the inorganic insulating layer comprises an inorganic buffer layer, a gate insulating layer and an interlayer insulating layer, the metal wire layer being a source/drain metal layer, then the method further comprises:

Sequentially forming a passivation layer, a planarization layer, a pixel defining layer and a packaging layer on the source/drain metal layer. In one embodiment, the passivation layer is continuous such that no passivation layer is present on the first metal wire layer portion It is to be understood that if the inorganic insulating layer comprises an inorganic buffer layer, a gate insulating layer and an interlayer insulating layer, the metal wire layer is a source/drain metal layer. Then, the inorganic buffer layer, the gate insulating layer and the interlayer insulating layer are etched in a predetermined bending resistant region such that the metal wire layer is directly formed on the base or the organic buffer layer.

In one embodiment, the step of forming the packaging layer specifically comprises alternately depositing a plurality of inorganic layers and organic layers to form the packaging layer.

A further embodiment of the present disclosure provides a display device comprising the above-described display substrate. The display device may be a product or a component having a display function such as a television set, a display, a tablet computer, a mobile phone, an electronic paper, a navigator, a digital photo frame, a video camera, a camera, or the like.

In order to more clearly illustrate the technical solutions of the present disclosure, several specific embodiments are provided below to provide a detailed description.

Embodiment 1

Figure 3:
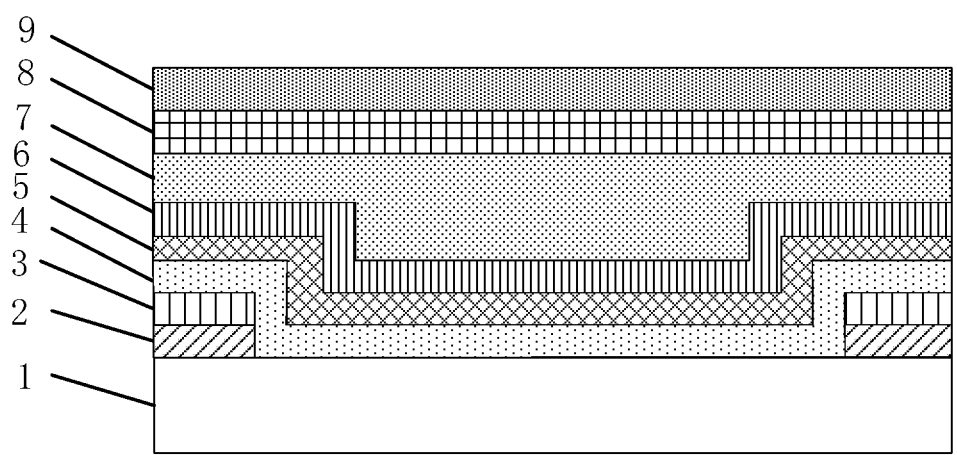
FIG. 3 is a schematic partial cross-sectional view of a display substrate provided in Embodiment 1 of the present disclosure.

As shown in FIG. 3, a schematic cross-sectional view of a display substrate of Embodiment 1 is shown. It should be understood that in FIG. 3 and FIGS. 4-9 below, a cross-sectional view of the bending resistant region 13 and its adjacent regions of the display substrate of FIG. 1 is shown.

Specifically, in the bending resistant region, a base 1 and a metal wire layer 4 are included. Wherein the metal wire layer 4 is directly formed on the base 1.

In a region adjacent to the bending resistant region, the base 1 further comprises an inorganic buffer layer 2 and a gate insulating layer 3 thereon, while a metal wire layer 4 is formed on the gate insulating layer 3. The metal wire layer 4 may be a gate metal layer.

Further, an interlayer insulating layer 5, a passivation layer 6, a planarization layer 7, a pixel defining layer 8, and a packaging layer 9 are sequentially formed on the metal wire layer 4.

In this way, in the bending resistant region, the metal wire layer 4 is directly formed on the base 1, that is, the metal wire layer 4 can be in direct contact with the flexible substrate 1, which can prevent the breakage of the metal wire layer 4 due to the breakage of the gate insulating layer 3 and the inorganic buffer layer 2 when they are being bent.

Embodiment 2

Figure 4:
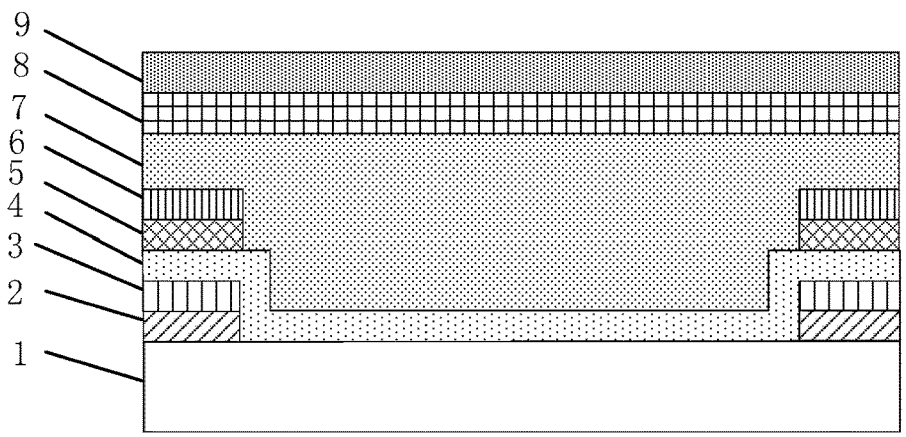
FIG. 4 is a schematic partial cross-sectional view of a display substrate provided in Embodiment 2 of the present disclosure.

As shown in FIG. 4, a schematic cross-sectional view of a display substrate provided by Embodiment 2 is shown.

The difference between the display substrate in Embodiment 2 and the display substrate structure in Embodiment 1 is that, The interlayer insulating layer 5 and the passivation layer 6 are etched such that the interlayer insulating layer 5 and the passivation layer 6 are not included in the bending resistant region and the planarization layer 7 is directly formed on the metal wire layer 4.

The structure of the other portions of the display substrate in Embodiment 2 is the same as that of Embodiment 1, and will not be described again.

Embodiment 3

Figure 5:
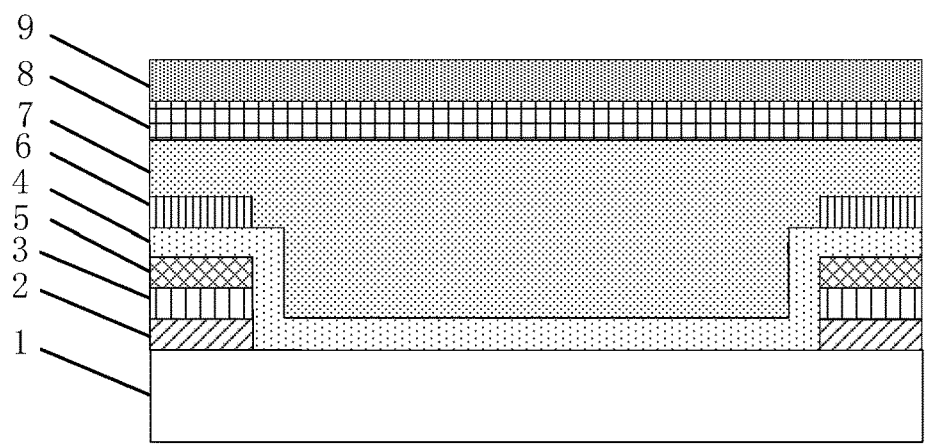
FIG. 5 is a schematic partial cross-sectional view of a display substrate provided in Embodiment 3 of the present disclosure.

As shown in FIG. 5, a schematic view of a partial cross-sectional structure of a display substrate provided by Embodiment 3 is shown.

The difference between the display substrate in Embodiment 3 and the display substrate structure in Embodiment 2 is that, The metal wire layer 4 is a source/drain metal layer, and then in a region adjacent to the bending resistant region, the base 1 comprises an inorganic buffer layer 2, a gate insulating layer 3, and an interlayer insulating layer 5, and the metal wire layer 4 is formed on the interlayer insulating layer 5.

Further, a passivation layer 6, a planarization layer 7, a pixel defining layer 8, and a packaging layer 9 are sequentially formed on the metal wire layer 4.

The structure of the other portions of the display substrate in Embodiment 3 is the same as that of Embodiment 2, and will not be described again.

Embodiment 4

Figure 6:
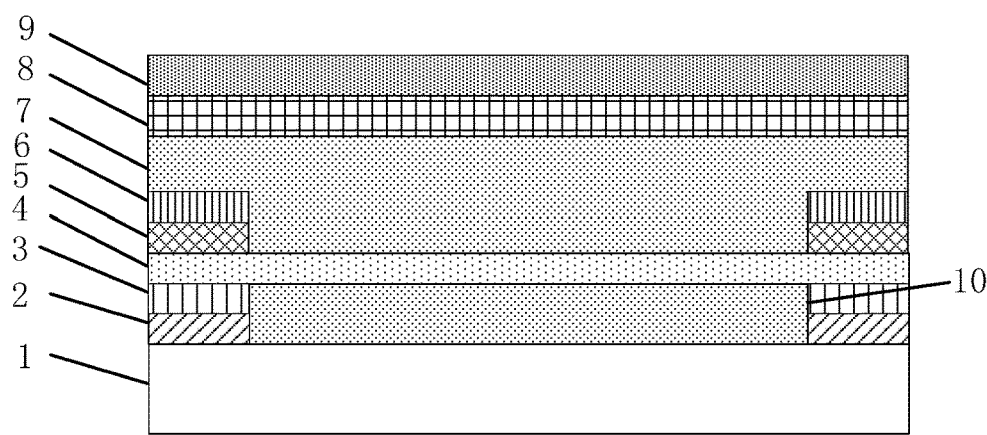
FIG. 6 is a schematic partial cross-sectional view of a display substrate provided in Embodiment 4 of the present disclosure.

As shown in FIG. 6, a schematic cross-sectional view of a display substrate provided by Embodiment 4 is shown.

Specifically, in the bending resistant region, the base 1, the metal wire layer 4, and the organic buffer layer 10 between the base 1 and the metal wire layer 4 are included, wherein the metal wire layer 4 is directly formed on the organic buffer layer 10.

In a region adjacent to the bending resistant region, the base 1 further comprises an inorganic buffer layer 2 and a gate insulating layer 3, while the metal wire layer 4 is formed on the gate insulating layer 3, and the metal wire layer 4 is a gate metal layer.

Further, an interlayer insulating layer 5, a passivation layer 6, a planarization layer 7, a pixel defining layer 8, and a packaging layer 9 are sequentially formed on the metal wire layer 4.

It is to be understood that the interlayer insulating layer 5 and the passivation layer 6 can be etched such that the interlayer insulating layer 5 and the passivation layer 6 are not included in the bending resistant region and the planarization layer 7 is directly formed on the metal wire Layer 4.

Thus, in the bending resistant region, the metal wire layer 4 is directly formed on the organic buffer layer 10, i.e. the metal wire layer 4 is in direct contact with the organic buffer layer 10. The organic buffer layer 10 is not easily broken when the bending resistant region is bent, then this structure can effectively prevent the breakage of the metal wire layer 4 when this region is bent.

Embodiment 5

Figure 7:
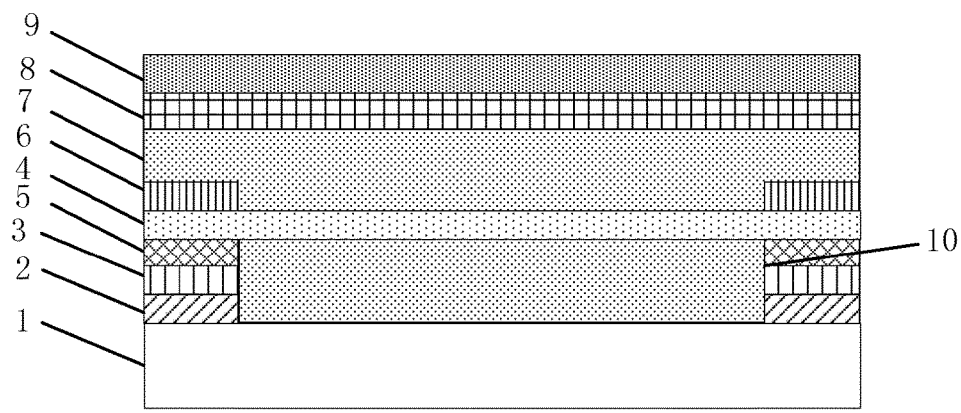
FIG. 7 is a schematic partial cross-sectional view of a display substrate provided in Embodiment 5 of the present disclosure.

As shown in FIG. 7, a schematic cross-sectional view of a display substrate provided by Embodiment 5 is shown.

The difference between the display substrate in Embodiment 5 and the display substrate structure in Example 4 is that, The metal wire layer 4 is a source/drain metal layer, and in a region adjacent to the bending resistant region, the base 1 comprises thereon an inorganic buffer layer 2, a gate insulating layer 3, and an interlayer insulating layer 5 and the metal wire layer 4 is formed on the interlayer insulating layer 5.

Further, in a region adjacent to the bending resistant region, a passivation layer 6, a planarization layer 7, a pixel defining layer 8, and a packaging layer 9 are sequentially formed on the metal wire layer 4.

The structure of the other portions of the display substrate in Embodiment 5 is the same as that of Embodiment 4, and will not be described again.

Embodiment 6

Figure 8:
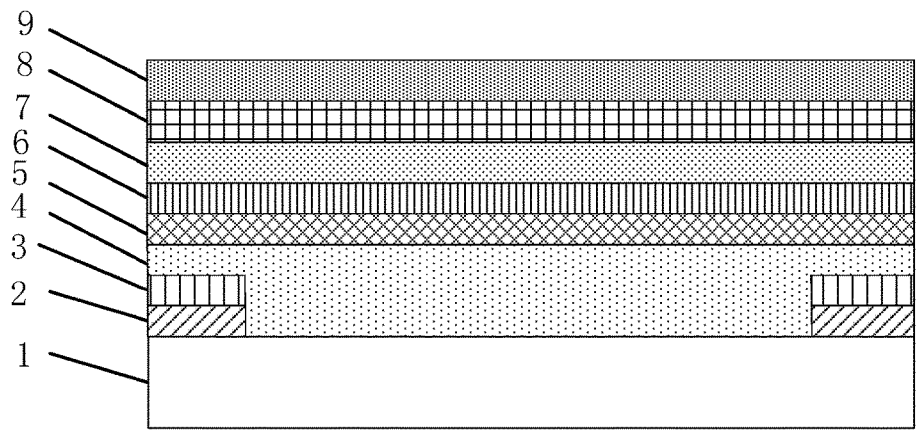
FIG. 8 is a schematic partial cross-sectional view of a display substrate provided in Embodiment 6 of the present disclosure.

As shown in FIG. 8, a schematic cross-sectional view of a display substrate provided by Embodiment 6 is shown.

The difference between the display substrate in Embodiment 6 and the display substrate structure in Embodiment 1 is that, In the bending resistant region, the thickness of the metal wire layer 4 is increased such that the upper surface of the metal wire layer 4 is flat.

It can be seen that the thickness of the metal wire layer 4 is large in the bending resistant region, and the metal wire layer 4 is not easily broken when the region is bent.

The structure of the other portions of the display substrate in Embodiment 6 is the same as that of Embodiment 1, and will not be described again.

Embodiment 7

Figure 9:
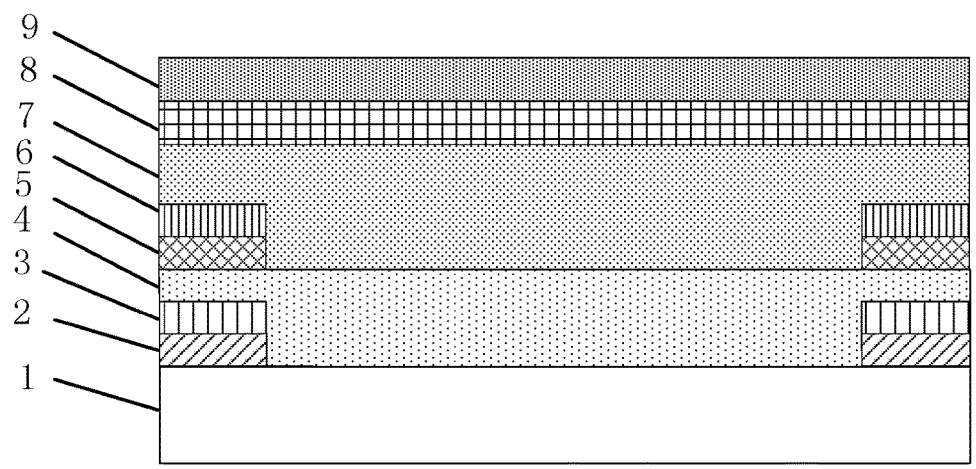
FIG. 9 is a schematic partial cross-sectional view of a display substrate provided in Embodiment 7 of the present disclosure.

As shown in FIG. 9, a schematic cross-sectional view of a display substrate provided by Embodiment 7 is shown.

The difference between the display substrate in Embodiment 7 and the display substrate structure in Embodiment 6 is that, The interlayer insulating layer 5 and the passivation layer 6 are etched such that the interlayer insulating layer 5 and the passivation layer 6 are not included in the bending resistant region and the planarization layer 7 is directly formed on the metal wire layer 4.

The structure of the other portions of the display substrate in Embodiment 7 is the same as that of Embodiment 6, and will not be described again.

Embodiment 8

Figure 10:
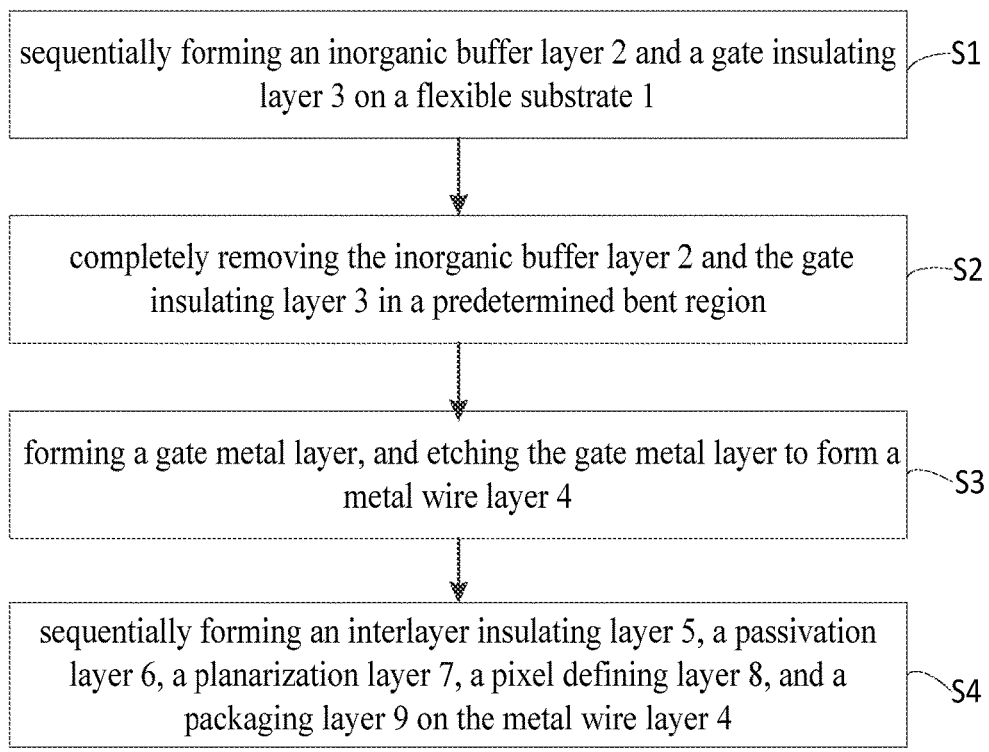
FIG. 10 is a schematic flow chart showing a method for manufacturing a display substrate provided in Embodiment 8 of the present disclosure.

In order to more clearly illustrate the technical solution of the present disclosure, Embodiment 8 is described below in combination with a schematic cross-sectional view of the display substrate structure shown in FIG. 3. As shown in FIG. 10, the method for manufacturing in this embodiment may specifically comprises the following steps:

S1: sequentially forming an inorganic buffer layer 2 and a gate insulating layer 3 on a flexible substrate 1;

S2: completely removing the inorganic buffer layer 2 and the gate insulating layer 3 in a predetermined bending resistant region;

S3: forming a gate metal layer, etching the gate metal layer to form a metal wire layer 4;

S4: sequentially forming an interlayer insulating layer 5, a passivation layer 6, a planarization layer 7, a pixel defining layer 8, and a packaging layer 9 on the metal wire layer 4.

It is to be understood that the interlayer insulating layer 5 and the passivation layer 6 can be further etched such that the interlayer insulating layer 5 and the passivation layer 6 are not included in the resist resistant region to obtain a display substrate as shown in FIG. 4; the metal wire layer 4 may be formed by using a source/drain metal layer to obtain a display substrate as shown in FIG. 5; an organic buffer layer 10 may be formed between the base 1 and the metal wire layer 4 in a bending resistant region, to obtain a display substrate shown in FIGS. 6 and 7; the thickness of the metal wire layer 4 can be increased in the bending resistant region such that the upper surface of the metal wire layer 4 is flat to obtain the display substrate shown in FIGS. 8 and 9. The present embodiment is not limited thereto, and will not be described again.

The foregoing embodiments are merely illustrative of the technical solutions of the present disclosure and are not intended to be limiting thereof; although the present disclosure has been described in detail with reference to the foregoing embodiments, it will be understood by those of ordinary skill in the art that they still can amend the technical solutions disclosed in the preceding embodiments or equivalently replace part of the technical features therein, and these modifications or substitutions do not depart the essence of the corresponding technical solutions depart from the spirit and scope of the technical solutions of the various embodiments of the present disclosure.

What is claimed is:

1. A display substrate, comprising:
a base;
a metal wire layer positioned on the base;
a first region;
a second region adjacent the first region, the base including a first base portion in the first region and a second base portion in the second region, and the metal wire layer including a first metal wire layer portion in the first region and a second metal wire layer portion in the second region; and
an inorganic layer insulating layer positioned on the second base portion, the second metal wire portion positioned on the inorganic insulating layer;
wherein the first metal wire layer portion is positioned directly on the first base portion, or an organic buffer layer is positioned between the first base portion and the first metal wire layer portion and the first metal wire layer portion is positioned directly on the organic buffer layer; and
wherein:
the inorganic insulating layer includes the inorganic buffer layer and a gate insulating layer and the metal wire layer includes a gate metal layer, and an interlayer insulating layer, a passivation layer, a planarization layer, a pixel defining layer and a packaging layer are sequentially positioned on the gate metal layer; or
the inorganic insulating layer includes the inorganic buffer layer, the gate insulating layer and an interlayer insulating layer, the metal wire layer includes a source and/or drain metal layer, and the passivation layer, the planarization layer, the pixel defining layer, and the packaging layer are sequentially positioned on the source and/or drain metal layer; or
the first metal wire layer portion is positioned directly on the first base portion and a thickness of the first metal wire layer portion is greater than or equal to a thickness of the second metal wire layer portion so an upper surface of the metal wire layer is flat.

2. The display substrate according to claim 1, further comprising a display region and bezel regions on opposite sides of the display region, wherein the first region is located in the bezel regions.

3. The display substrate according to claim 1, wherein the first metal wire layer portion is positioned directly on the first base portion and the thickness of the first metal wire layer portion is greater than or equal to the thickness of the second metal wire layer portion where the upper surface of the metal wire layer is flat.

4. The display substrate according to claim 1, wherein the base comprises at least one of polyimide, polycarbonate, polyacrylate, polyetherimide, polyethersulfone, polyethylene terephthalate and polyethylene naphthalate.

5. The display substrate according to claim 1, wherein the packaging layer includes a plurality of alternate inorganic layers and organic layers.

6. The display substrate according to claim 1, wherein the inorganic insulating layer comprises the inorganic buffer layer and the gate insulating layer, the metal wire layer includes the gate metal layer, and the interlayer insulating layer, the passivation layer, the planarization layer, the pixel defining layer and the packaging layer are sequentially formed on the gate metal layer.

7. The display substrate according to claim 6, wherein the interlayer insulating layer and the passivation layer are discontinuous with the interlayer insulating layer and the passivation layer not positioned on the first metal wire layer portion.

8. The display substrate according to claim 1, wherein the inorganic insulating layer comprises the inorganic buffer layer, the gate insulating layer and the interlayer insulating layer, the metal wire layer is the source and/or drain metal layer, and the passivation layer, the planarization layer, the pixel defining layer, and the packaging layer are sequentially positioned on the source and/or drain metal layer.

9. The display substrate according to claim 8, wherein the passivation layer is discontinuous with the passivation layer not positioned on the first metal wire layer portion.

10. A display device comprising a display body including the display substrate according to claim 1.

11. A method for manufacturing a display substrate, the method comprising:
providing a base including a first base portion and a second base portion adjacent the first base portion;
forming a metal wire layer on the base, with a first metal wire layer portion of the metal wire layer formed directly on a first base portion of the base, or an organic buffer layer provided between a first metal wire layer portion of the metal wire layer and the first base portion of the base and the first metal wire layer portion positioned directly on the organic buffer layer; and at least one of:

forming the inorganic insulating layer on the first base portion and the second base portion, and removing the inorganic insulating layer on the first base portion; or forming the inorganic insulating layer only on the second base portion so the inorganic insulating layer is positioned between the second base portion of the base and a second metal wire layer portion of the metal wire layer, the inorganic insulating layer including an inorganic buffer layer and a gate insulating layer, the metal wire layer including a gate metal layer, and sequentially forming an interlayer insulating layer, a passivation layer, a planarization layer, a pixel defining layer and a packaging layer on the gate metal layer; or forming the inorganic insulating layer only on the second base portion so the inorganic insulating layer is positioned between the second base portion of the base and a second metal wire layer portion of the metal wire layer, the inorganic insulating layer including the inorganic buffer layer, the gate insulating layer and an interlayer insulating layer, the metal wire layer including a source and/or drain metal layer, and sequentially forming the passivation layer, the planarization layer, the pixel defining layer and the packaging layer on the source and/or drain metal layer.

12. The method according to claim 11, wherein forming the inorganic insulating layer includes forming the inorganic insulating layer on the first base portion and the second base portion and removing the inorganic insulating layer on the first base portion.

13. The method according to claim 11, wherein forming the packaging layer comprises:

alternately depositing a plurality of inorganic layers and organic layers to form the packaging layer.

14. The method according to claim 11, wherein forming the inorganic insulating layer includes forming the inorganic insulating layer only on the second base portion with the inorganic insulating layer provided between the second base portion of the base and the second metal wire layer portion of the metal wire layer.

15. The method according to claim 14, wherein the inorganic insulating layer comprises the inorganic buffer layer and the gate insulating layer, the metal wire layer includes the gate metal layer, and sequentially forming the layers includes sequentially forming the interlayer insulating layer, the passivation layer, the planarization layer, the pixel defining layer and the packaging layer on the gate metal layer.

16. The method according to claim 15, wherein the interlayer insulating layer and the passivation layer are discontinuous with the interlayer insulating layer and the passivation layer not positioned on the first metal wire layer portion.

17. The method according to claim 14, wherein the inorganic insulating layer comprises the inorganic buffer layer, the gate insulating layer and the interlayer insulating layer, the metal wire layer includes a source and/or drain metal layer, and sequentially forming the layers includes sequentially forming the passivation layer, the planarization layer, the pixel defining layer and the packaging layer on the source and/or drain metal layer.

18. The method according to claim 17, wherein the passivation layer is discontinuous with passivation layer not positioned on the first metal wire layer portion.

19. A method for manufacturing a display device, comprising manufacturing a display body including the display substrate manufactured according to claim 11.

* * * * *